United States Patent
Mao et al.

(10) Patent No.: US 12,289,927 B2
(45) Date of Patent: Apr. 29, 2025

(54) IMAGE SENSOR DIAGONAL ISOLATION STRUCTURES

(71) Applicant: OMNIVISION TECHNOLOGIES, INC., Santa Clara, CA (US)

(72) Inventors: Duli Mao, Sunnyvale, CA (US); Qin Wang, San Jose, CA (US); Bill Phan, San Jose, CA (US); Shiyu Sun, Cupertino, CA (US); Hui Zang, San Jose, CA (US)

(73) Assignee: Omni Vision Technologies, Inc., Santa Clara, CA (US)

( * ) Notice: Subject to any disclaimer, the term of this patent is extended or adjusted under 35 U.S.C. 154(b) by 418 days.

(21) Appl. No.: 17/705,133

(22) Filed: Mar. 25, 2022

(65) Prior Publication Data

US 2023/0307478 A1 Sep. 28, 2023

(51) Int. Cl.
*H10F 39/00* (2025.01)

(52) U.S. Cl.
CPC ....... *H10F 39/807* (2025.01); *H10F 39/8067* (2025.01)

(58) Field of Classification Search
CPC ................. H01L 27/1463; H01L 27/14629
See application file for complete search history.

(56) References Cited

U.S. PATENT DOCUMENTS

| | | | |
|---|---|---|---|
| 8,071,455 B2 | 12/2011 | Cole et al. | |
| 8,698,217 B2 | 4/2014 | Hsu et al. | |
| 8,866,250 B2 | 10/2014 | Ting et al. | |
| 9,397,129 B2 | 7/2016 | Chien et al. | |
| 9,911,780 B1 | 3/2018 | Wang et al. | |
| 9,947,714 B2* | 4/2018 | Lee | H01L 27/14636 |
| 9,985,062 B2 | 5/2018 | Jung | |
| 10,165,211 B1* | 12/2018 | Borthakur | H04N 25/702 |
| 2006/0011813 A1* | 1/2006 | Park | H01L 27/14645 |
| | | | 257/E27.134 |
| 2011/0089517 A1* | 4/2011 | Venezia | H01L 27/14603 |
| | | | 257/443 |
| 2011/0221947 A1* | 9/2011 | Awazu | H01L 27/14812 |
| | | | 348/311 |
| 2013/0076951 A1* | 3/2013 | Endo | H04N 25/63 |
| | | | 257/E27.15 |
| 2013/0127002 A1* | 5/2013 | Okigawa | H04N 25/704 |
| | | | 257/432 |

(Continued)

*Primary Examiner* — Bitew A Dinke
(74) *Attorney, Agent, or Firm* — Christensen O'Connor Johnson Kindness PLLC

(57) ABSTRACT

Image sensors, isolation structures, and techniques of fabrication are provided. An image sensor includes a source of electromagnetic radiation disposed on a substrate, a pixel array disposed on the substrate and thermally coupled with source of electromagnetic radiation, and an isolation structure disposed on the substrate between the source of electromagnetic radiation and the pixel array. The isolation structure can define a first reflective surface oriented on a first bias relative to a lateral axis of the pixel array and a second reflective surface oriented on a second bias relative to the lateral axis. The isolation structure can be configured to attenuate residual electromagnetic radiation reaching a proximal region of the pixel array by pairing a first reflection and a second reflection of the electromagnetic radiation by the first reflective surface and the second reflective surface.

19 Claims, 7 Drawing Sheets

(56) References Cited

U.S. PATENT DOCUMENTS

| | | | | |
|---|---|---|---|---|
| 2015/0035103 A1* | 2/2015 | Inoue | H01L 27/14641 | |
| | | | | 438/69 |
| 2015/0263060 A1* | 9/2015 | Park | H01L 27/14636 | |
| | | | | 257/432 |
| 2016/0056188 A1* | 2/2016 | Lee | H01L 27/14643 | |
| | | | | 257/446 |
| 2016/0204144 A1* | 7/2016 | Lee | H01L 27/14643 | |
| | | | | 257/432 |
| 2016/0233262 A1* | 8/2016 | Goto | H01L 27/14609 | |
| 2017/0104019 A1* | 4/2017 | Jung | H01L 23/373 | |
| 2017/0256574 A1* | 9/2017 | Lee | H01L 27/14643 | |
| 2018/0006077 A1* | 1/2018 | Lee | H04N 25/702 | |
| 2018/0019280 A1* | 1/2018 | Lee | H01L 27/14687 | |
| 2018/0158864 A1* | 6/2018 | Kim | H01L 21/8238 | |
| 2019/0088700 A1* | 3/2019 | Yang | H01L 27/14623 | |
| 2019/0221597 A1* | 7/2019 | Noh | H01L 27/14605 | |
| 2019/0229150 A1* | 7/2019 | Isono | H01L 27/14665 | |
| 2020/0075643 A1* | 3/2020 | Han | H01L 23/5226 | |
| 2020/0235148 A1* | 7/2020 | Shim | H01L 27/14627 | |
| 2020/0273894 A1* | 8/2020 | Inui | H01L 27/1461 | |
| 2021/0104560 A1 | 4/2021 | Lee | | |
| 2021/0257399 A1* | 8/2021 | Goden | H01L 27/14621 | |
| 2021/0265397 A1 | 8/2021 | Han et al. | | |
| 2022/0020804 A1* | 1/2022 | Kim | H01L 27/14685 | |
| 2022/0068982 A1* | 3/2022 | Ha | H01L 27/1463 | |
| 2022/0181376 A1* | 6/2022 | Lee | H01L 27/14636 | |
| 2022/0352216 A1* | 11/2022 | Jang | H10F 39/8063 | |
| 2022/0415957 A1* | 12/2022 | Oh | H01L 27/14625 | |
| 2023/0005971 A1* | 1/2023 | Han | H01L 27/14627 | |
| 2023/0115792 A1* | 4/2023 | Maehashi | H01L 27/1463 | |
| | | | | 257/292 |
| 2023/0117198 A1* | 4/2023 | Ito | H10F 39/807 | |
| | | | | 257/435 |
| 2023/0120066 A1* | 4/2023 | Kim | H01L 27/14685 | |
| | | | | 257/432 |
| 2023/0207592 A1* | 6/2023 | Watanabe | H01L 27/14623 | |
| | | | | 257/572 |
| 2024/0136371 A1* | 4/2024 | Okawa | H01L 27/1463 | |
| 2024/0170517 A1* | 5/2024 | Nishida | H01L 27/14645 | |

* cited by examiner

IMAGE SENSOR DIAGONAL ISOLATION STRUCTURES

TECHNICAL FIELD

This disclosure relates generally to image sensors, and in particular but not exclusively, relates CMOS image sensors and applications thereof.

BACKGROUND INFORMATION

Image sensors are widely found in digital cameras, cellular phones, security cameras, and other imaging systems as used in medical, automobile, and other applications. As image sensors are integrated into a broader range of electronic devices it is desirable to enhance their functionality and performance (e.g., resolution, power consumption, dynamic range, etc.) with improvements to device architecture design and image processing.

The typical image sensor operates in response to image light reflected from an external scene that is incident upon the image sensor. The image sensor includes an array of pixels having photosensitive elements (e.g., photodiodes) that absorb a portion of the incident image light and generate image charge upon absorption of the image light. The image charge photogenerated by the pixels can be measured as an analog output image signals on column bitlines that vary as a function of the incident image light. In other words, the amount of image charge generated is proportional to the intensity of the image light, which is read out as analog image signals from the column bitlines and converted to digital values to produce digital images (i.e., image data) representing the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

Figure 1A:
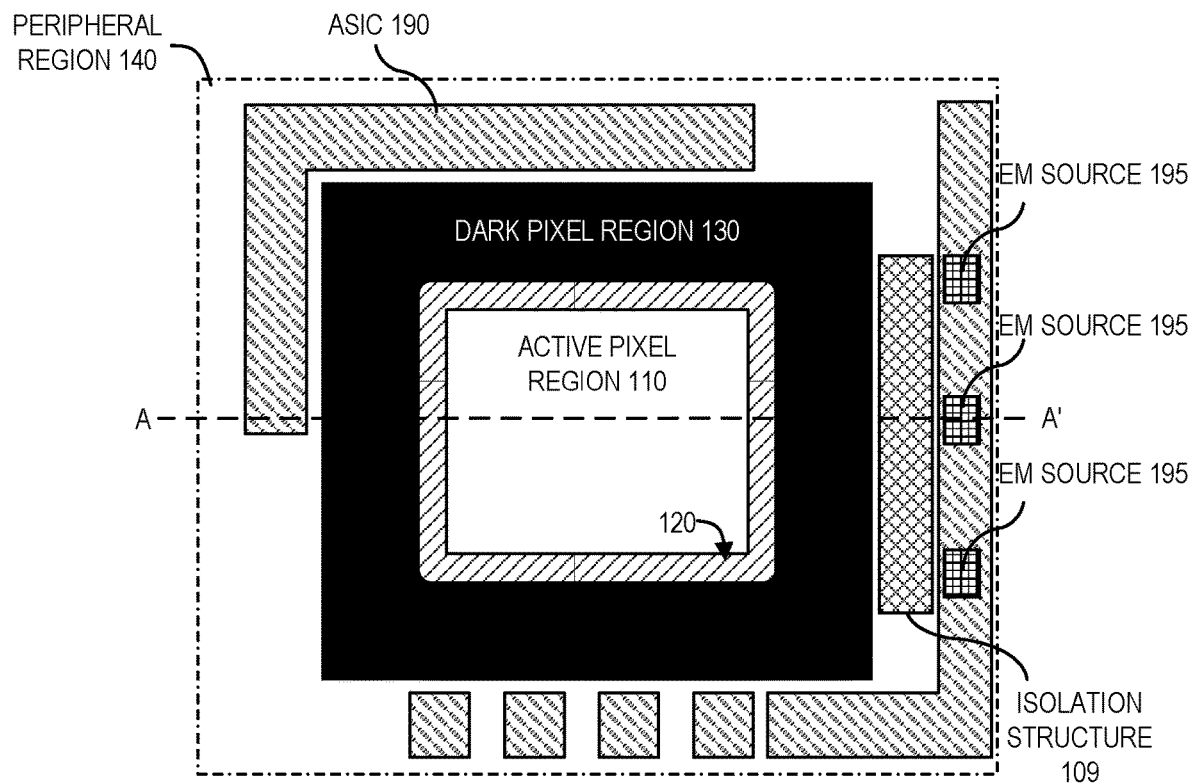
FIG. 1A illustrates a top view of an image sensor including an active pixel region, a dark pixel region, a source of electromagnetic radiation, and a diagonal deep trench isolation structure, in accordance with the embodiments of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures can be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Embodiments of an apparatus, system, and method each including or otherwise related to an image sensor with diagonal deep trench isolation structures configured to improve electromagnetic isolation of active pixels are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the embodiment is included in at least one embodiment of the present invention. Thus, the appearances of the phrases "in one example" or "one embodiment" in various places throughout this specification are not necessarily all referring to the same embodiment. Furthermore, the particular features, structures, or characteristics can be combined in a suitable manner in one or more embodiments.

Spatially relative terms, such as "beneath," "below," "over," "under," "above," "upper," "top," "bottom," "left," "right," "center," "middle," and the like, can be used herein for ease of description to describe one element or feature's relationship relative to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device can be otherwise oriented (rotated ninety degrees or at other orientations) and the spatially relative descriptors used herein are interpreted accordingly. In addition, it will also be understood that when an element is referred to as being "between" two other elements, it can be the only element between the two other elements, or one or more intervening elements can also be present.

Throughout this specification, several terms of art are used. These terms are to take on their ordinary meaning in the art from which they come, unless specifically defined herein or the context of their use would clearly suggest otherwise. It should be noted that element names and symbols can be used interchangeably through this document (e.g., Si vs. silicon); however, both have identical meaning.

Advancements in semiconductor processing techniques have enabled the fabrication of complementary metal oxide semiconductor devices (e.g. image sensors, processors, displays, and the like) with increasingly smaller feature sizes, which has enabled miniaturization of many devices. For image sensors, miniaturization has produced devices in which image sensor components including photodiodes and metallization layers are formed on a shared substrate with signal processing and control circuitry, such as application specific integrated circuits (ASICs) and power circuits. Among the benefits of miniaturization are the reduction in power demand for image sensors, a reduction in overall sensor area, and an increase in pixel density. That being said, control and power circuitry generate heat that is transported through the shared substrate and induces dark current nonuniformity in image sensor pixel arrays. As a result, conventional approaches for correcting for dark current lose effectiveness with increasing miniaturization. There is a need, therefore, for techniques to attenuate electromagnetic radiation that is laterally transported in semiconductor substrates before it reaches photodiodes to nonuniformly induce dark current.

Embodiments described herein include an image sensor configured to attenuate electromagnetic radiation transported laterally through a semiconductor substrate of the image sensor. The image sensor includes diagonal isolation structures formed between pixels of the image sensor pixel array, which can include active pixels, dark pixels, and/or dummy pixels. The diagonal isolation structure can include a triangular sawtooth pattern (e.g., a triangular "zig-zag") describing a substantially linear axis, with the axis oriented substantially orthogonal to a lateral axis of the image sensor (e.g., axis A-A' of FIG. 1A). Alternatively, the diagonal isolation structure can include a rotated square lattice, rotated rectangular lattice, rotated rhomboid lattice, or other geometric lattice. Advantageously, diagonal isolation structures described herein can be formed by processes already implemented by CMOS manufacturing systems, including but not limited to photolithographic patterning, deposition and etch, and planarization. Additionally, diagonal isolation structures described herein reflect EM radiation including thermal energy away from pixels of the image sensor more effectively than conventional isolation structures, such as deep-trench isolation structures that are formed to reduce optical cross talk between photodiodes, which typically assume a square lattice configuration that is aligned with the vertical and lateral alignments of the image sensor.

FIG. 1A is a schematic diagram illustrating a plan view of an example image sensor 100 including an active pixel region 110, a dark pixel region 130, and a diagonal deep trench isolation structure 109, in accordance with the embodiments of the present disclosure. Image sensor 100 includes active pixel region 110, dummy pixel region 120, dark pixel region 130, peripheral region 140, one or more application specific integrated circuits (ASIC) 190, of which one or more components can act as sources of electromagnetic (EM) radiation 195. In the illustrated embodiment, dummy pixel region 120, dark pixel region 130, and peripheral region 140 laterally surround active pixel region 110. Dummy pixel region 120 is disposed between active pixel region 110 and dark pixel region 130. Dark pixel region 130 is disposed between peripheral region 140 and dummy pixel region 120. Dark pixel region 130 is also disposed between peripheral region 140 and active pixel region 110. ASIC(s) 190 and EM Source(s) 195 are illustrated within the peripheral region 140.

Active pixel region 110 includes one or more active pixel photodiodes 112 (in reference to FIG. 1B) to generate one or more image signals representative of an external scene. For example, in response to incident light (e.g., electromagnetic (EM) radiation having an energy that is detectable by human eyes, EM radiation that is invisible to human eyes, etc.) on active pixel region 110, image charge can be collected by active pixel photodiodes 112 of active pixel region 110. The image charge can be read out as an analog signal that is converted to a digital signal (e.g., an image signal for a given one or more pixels included in active pixel region 110). Dark pixel region 130 includes dark pixel photodiodes 132 (in reference to FIG. 1B) to generate one or more dark current reference signals (e.g., based on a readout of one or more dark pixel photodiodes included in the dark pixel region 130). Dark current reference signals can be generated by dark pixel photodiodes 132 to correct for noise output from active pixel photodiodes 112. For example, dark current can result in an elevated baseline in image signals and can reduce the signal to noise ratio of image sensor 100, impairing sensor performance. Dark current correction can include, but is not limited to, baseline correction and/or denoising techniques, such as subtracting dark current reference signals from the one or more image signals.

In some embodiments, a dummy pixel region 120 can be included between dark pixel region 130 and active pixel region 110. Dummy pixel region 120 can include multiple dummy pixel photodiodes 122 (in reference to FIG. 1B), which can correspond to non-imaging photodiodes. For example, dummy pixel region 120 can be disposed between active pixel region 110 to isolate active pixel photodiodes 112 from dark pixel region 130, ASIC 190, EM Source 195, other circuitry or logic not illustrated that can be disposed within peripheral region 140, or other components of the image sensor 100.

Dummy pixel region 120 and dark pixel region 130 are illustrated in FIG. 1A as being substantially concentric with active pixel region 110. In some embodiments, dummy pixel region 120 and dark pixel region 130 can adopt different configurations including but not limited to an open loop shape, a rectangular shape, a circular shape, or otherwise, as described in more detail in reference to FIG. 3A. For example, dark pixel region 130 can partially surround active pixel region 110 and can define one more gaps to provide additional area for forming circuitry or other components (e.g., ASIC 190). Dark pixel region 130 can have a rectangular shape that is aligned with a row or a column of active pixel photodiodes included in the active pixel region 110. In some embodiments, the plurality of active pixel photodiodes included in the active pixel region 110 are arranged (e.g., in rows and columns) such that the active pixel region 110 has a square or rectangular shape. However, in other embodiments, the active pixel region 110 can have a different shape (e.g., a circular shape, a hexagonal shape, or another shape).

Figure 1B:
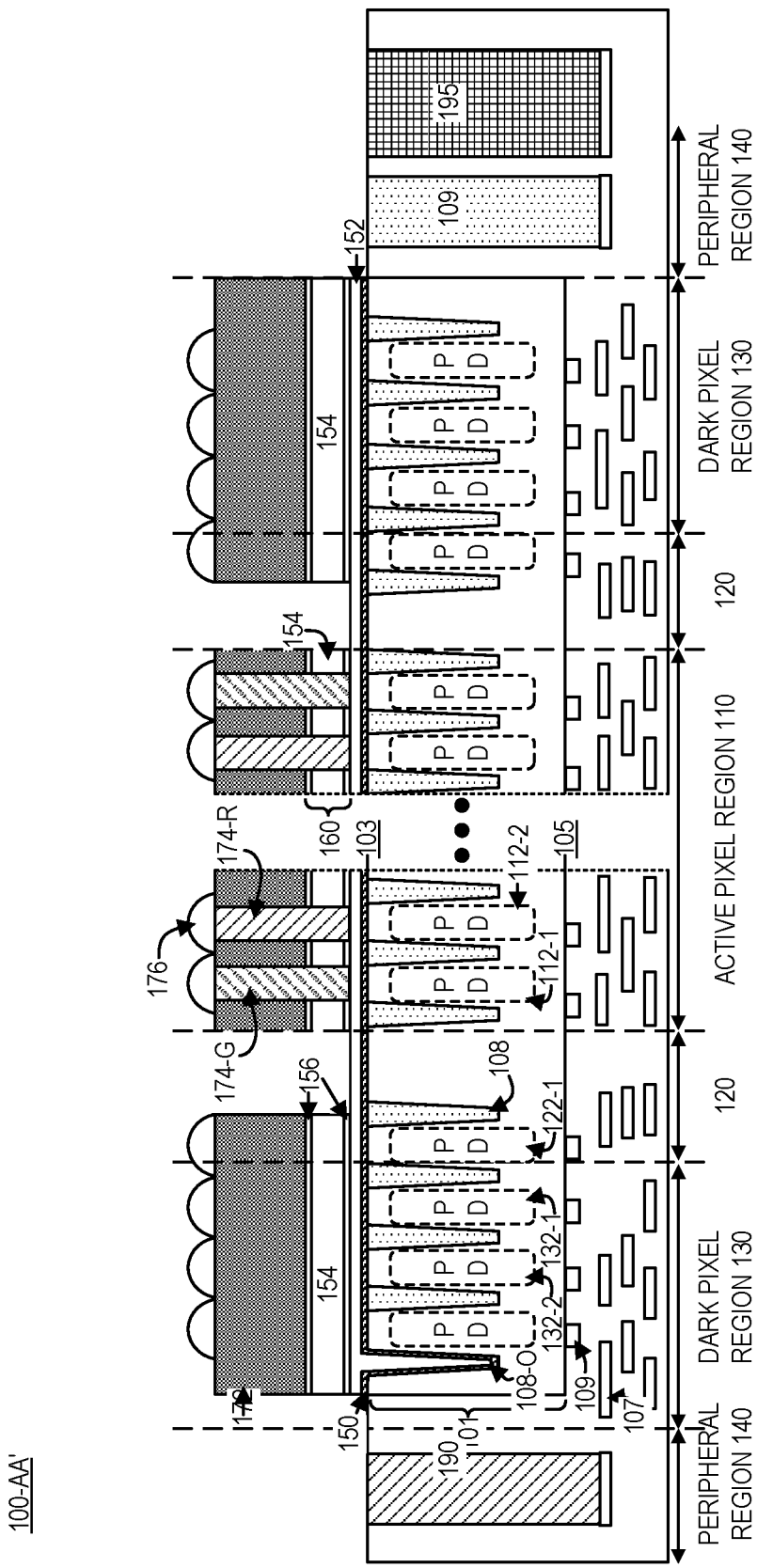
FIG. 1B illustrates a cross-sectional view of the image sensor illustrated in FIG. 1A along line A-A', in accordance with embodiments of the present disclosure.

FIG. 1B illustrates a cross-sectional view 100-AA' of the image sensor 100 illustrated in FIG. 1A along line A-A', in accordance with the embodiments of the present disclosure. Image sensor 100 includes active pixel region 110, dummy pixel region 120, dark pixel region 130, and peripheral region 140. Image sensor 100 further includes a semiconductor material 101 (e.g., silicon, a silicon germanium alloy, germanium, a silicon carbide alloy, an indium gallium arsenide alloy, other alloys formed of III-V compounds, other semiconductor materials or alloys, combinations thereof, a substrate thereof, a bulk substrate thereof, or a wafer thereof) with a first side 103 (e.g., a backside) and a second side 105 (e.g., a frontside), metal layers 107, isolation structures 108, diagonal trench structure(s) 109, active pixel photodiodes 112 (e.g., a first active pixel photodiode 112-1 and a second active pixel photodiode 112-2), dummy pixel photodiodes 122 (e.g., a first dummy pixel photodiode 122-1), dark pixel photodiodes 132 (e.g., a first dark pixel photodiode 132-1 and a second dark pixel photodiode 132-2), an anti-reflective (AR) layer 150, a buffer oxide layer 152, and one or more opaque and layers 154 and 156 to isolate and define active pixels 112, dark pixels 132, a buffer layer 172 (e.g., a ceramic or other oxide), color filters 174 (e.g., a green color filter 174-G, a red color filter 174-R, or other color filter), and micro-lenses 176.

For active pixel region 110, opaque layers 154 and 156 can form a stack to block or otherwise attenuate EM radiation incident upon the dark pixel region 130 (e.g., to block EM radiation from reaching the plurality of dark pixel photodiodes 132). Similarly, color filters 174 can be formed by patterned removal of portions of opaque layers 154 and 156 and subsequent deposition of color filter 174 material. In this way, opaque layers 154 and 156 serve to reduce crosstalk between neighboring photodiodes 112 of active pixel region 110, which is supported by the deposition of isolation structures 108, described in more detail below.

In one or more embodiments, first side 103 can be referred to as an illuminated surface or side of semiconductor material 101 and second side 105 can be referred to as a non-illuminated surface or side of semiconductor material 101. AR layer 150 can be disposed between first side 103 of the semiconductor material 101 and buffer oxide layer 152. In some embodiments, anti-reflective layer 150 includes tantalum oxide (e.g., $Ta_2O_5$), hafnium oxide (e.g., $HfO_2$), aluminum oxide (e.g., $Al_2O_3$), zirconium oxide (e.g., $Zr_2O_3$), or combinations thereof. Anti-reflective layer 150 can be about 10 nm thick, about 20 nm thick, about 30 nm thick, about 40 nm thick, about 50 nm thick, about 60 nm thick, about 70 nm thick, about 80 nm thick, about 90 nm thick, about 100 nm thick, about 110 nm thick, about 120 nm thick, about 130 nm thick, about 140 nm thick, about 150 nm thick, or thicker, including fractions and interpolations thereof. Buffer oxide layer 152 can be disposed between anti-reflective layer 150 and opaque layers 154 and 156. In some embodiments, buffer oxide layer 152 includes a dielectric oxide (e.g., $SiO_2$) and is at least 100 nm thick. In some embodiments, buffer oxide layer 152 has a thickness between 100 nm to 130 nm. Buffer oxide layer 152 can be disposed overlying AR layer 150 and underlying color filters 174. As such, buffer oxide layer 152 can be planarized to a substantially uniform surface to improve consistency between different active pixels 110. Buffer oxide layer 152 can impart improved structural integrity and chemical and/or radiation protection to underlying layers (e.g., the anti-reflective layer 150, the semiconductor material 101, etc.). For example, buffer oxide layer 152 can be disposed at a thickness to reinforce mechanical strength under chemical mechanical polishing (CMP) processes used for planarization and mitigate mechanical stress and other damage to anti-reflective layer 150, semiconductor material 101, etc.

In some embodiments, the semiconductor material 101 includes one or more layers disposed underneath buffer oxide layer 152 (e.g., between buffer oxide layer 152 and first side 103 of semiconductor substrate 101). For example, a surface passivation layer can be disposed between AR layer 152 and first side 103 of semiconductor material 101. Surface passivation layer can be formed of high-κ material (e.g., a material having a dielectric constant greater than the dielectric constant of silicon oxide) that provides a fixed negative charge (e.g., hafnium oxide, aluminum oxide, or other passivating oxide) to provide surface passivation of first side 103 of the semiconductor material. In this context, surface passivation describes a technique to reduce the impact of charge accumulation in photoelectric materials that can impair sensor operation and can lead to dielectric breakdown in some cases.

In active pixel region 110, dummy pixel region 120, and dark pixel region 130, Isolation structures 108 (e.g., deep trench isolation structures formed of at least an oxide material) are arranged to electrically and optically isolate individual photodiodes (e.g., active pixel photodiodes 112, dummy pixel photodiodes 122, and/or dark pixel photodiodes 132). Isolation structures 108 can extend from first side 103 of the semiconductor material 101 at least a portion of a distance between from first side 103 toward second side 105. In some embodiments, isolation structures 108 can be formed by deposition and removal operations, including but not limited to patterned reactive ion etching of semiconductor material 101, followed by depositing fill material (e.g., an oxide material, a low-n material, a different dielectric material, or combinations thereof) into trenches formed in semiconductor material 101.

In some embodiments, isolation structures 108 can be formed by patterned removal of semiconductor substrate material and subsequent deposition of one or more dielectric materials. In some embodiments, deposition can also include a metal material that can be included as a surface film (e.g., by prior deposition of metal material), as a ceramic-metal mixture (e.g., by concurrent deposition of metal and oxide materials), or as a metal fill material deposited on a dielectric base layer (e.g., by prior deposition of dielectric materials). In some embodiments, isolation structure 108 (see, e.g., isolation structure 108-O) is formed from anti-reflective layer 150, buffer oxide layer 152, and can include material layers between anti-reflective layer 150 and buffer oxide layer 152. In this way, anti-reflective layer 150, buffer oxide layer 152, and material layers if included (e.g., diffusion barriers, optical absorber materials, etc.) can at least partially line isolation structures 108.

It is appreciated that in some embodiments at least one isolation structure 108 in active pixel region 110, dummy pixel region 120, and/or dark pixel region 130 can be configured as isolation structure 108-O. In some embodiments a surface passivation layer is disposed between anti-reflective layer 150 and buffer oxide layer 152 to induce a hole accumulation region in the vicinity of buffer oxide layer 152. In this way, the surface passivation layer passivates surface defects and trench sidewall defects that can occur during fabrication that would otherwise impair the functioning of pixel photodiodes 112 and/or 132.

In some embodiments, buffer layer 172 is disposed between micro-lenses 176 and opaque layer(s) 154 and/or 156. In some embodiments, buffer layer 172 is a transparent (e.g., transparent to photons having a characteristic energy of incident visible and/or invisible light) dielectric layer including an oxide-based material (e.g., $SiO_2$) or a low-n material with a refractive index less than a corresponding refractive index of the semiconductor material 101, color filters 174, and/or micro-lenses 176. In some embodiments, at least a portion of buffer layer 172 has a thickness greater than 100 nm (e.g., 110 nm, 125 nm, 150 nm).

Peripheral region 140 can host electronic and optical components included as part of image sensor 100, including but not limited to diagonal isolation structure(s) 109, ASIC(s) 190, and/or EM radiation source(s) 195. As previously described in reference to FIG. 1A, EM radiation source(s) 195 can include components or elements of ASIC(s) 190 that generate EM radiation, such as visible photons and/or thermal energy, that can induce a non-uniform dark current in dark pixel region 130 and/or active pixel region 110. In some embodiments, EM radiation source(s) 190 include power circuit elements that are configured to convert supply power (e.g., from a battery) to input power for ASIC(s) 190. For example, a power circuit can include a voltage stepper circuit to increase the input voltage from a battery supply voltage by several orders of magnitude.

Figure 2A:
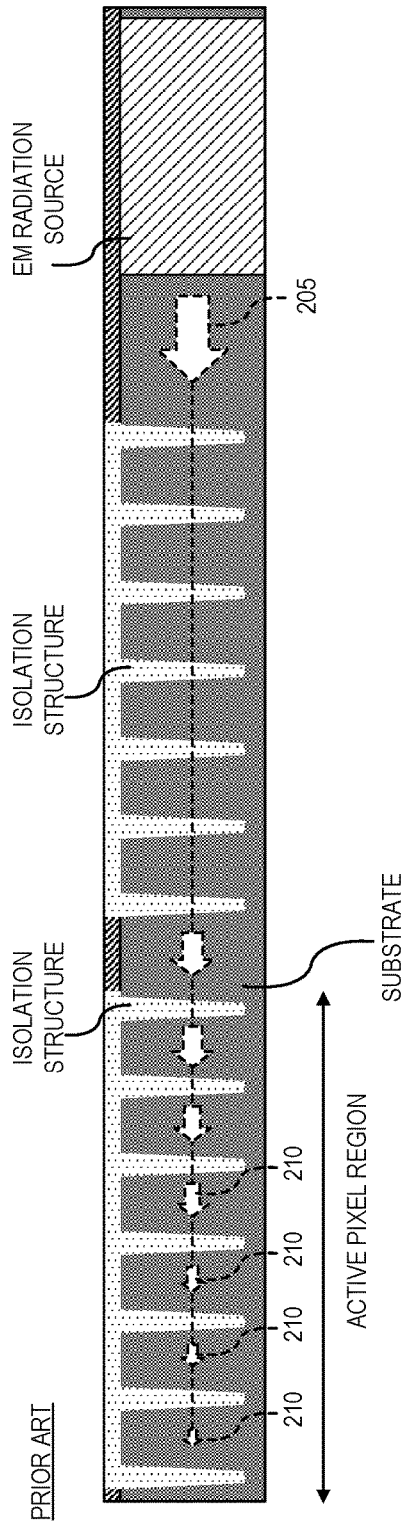
FIGS. 2A-2B illustrate conventional deep trench isolation structures as typically employed to reduce lateral transmission of electromagnetic radiation to active pixels of the active pixel region.
Figure 2B:
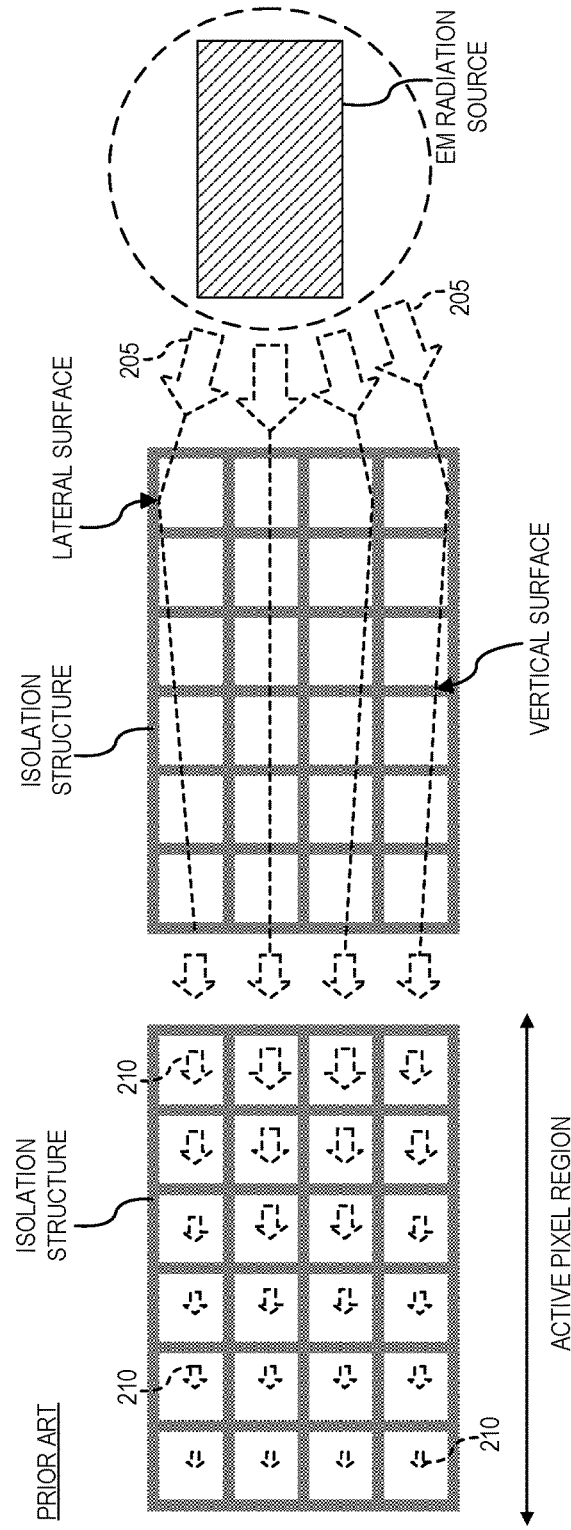

FIGS. 2A and 2B are schematic diagrams illustrating conventional isolation structures as typically employed to reduce lateral transmission of electromagnetic radiation to active pixels of the active pixel region. FIG. 2A represents a simplified cross-sectional diagram corresponding to the section illustrated in FIG. 1B, with components removed to simplify the visual explanations. As such, FIG. 2A omits photo-electric components, such as photodiodes, as well as polarization filters, color filters, micro-lenses, overlying layers, and other components, in order to focus description on the interaction of isolation structures with electromagnetic radiation transported through the substrate of an image sensor.

Isolation structures illustrated in FIG. 2A represent conventional rectangular lattice isolation structures in the active pixel region, the dummy pixel region, and/or the dark pixel regions of a conventional image sensor for which an EM radiation source is included in or on the substrate as part of a miniaturized sensor device. The EM radiation source can be or include a power circuit or other electronic element that generates heat during operation. As such, EM radiation 205 is illustrated being transported through the substrate from the EM radiation source toward the dark pixel region and/or the dummy pixel region. Isolation structures, as described in more detail in reference to FIG. 1B, are formed to limit crosstalk between pixels by reflecting and/or absorbing incident photons received through the first side of the image sensor. As such, isolation structures shown in FIG. 2A and FIG. 2B typically include sidewalls with sidewall angles approaching a vertical angle normal to the first side. It is noted that the sidewall angle in FIG. 2A is not to scale, being emphasized to illustrate the characteristic tapered shape of isolation structures. In this way, at least a portion of EM radiation 205 generated by the EM radiation source that is transported through the substrate will interact with isolation structures at a substantially normal angle of incidence to the sidewalls of the isolation structures. As would be understood by a person of ordinary skill in the optical arts, EM radiation, including but not limited to photons, can be transmitted through a material interface or reflected from the material interface based at least in part on the ratio of the indexes of refraction of the materials forming the interface and on the angle of incidence relative to the surface normal of the reflecting surface. Typically, the proportion of photons reflected at an interface increases with an increasing incidence angle relative the surface normal (e.g., where the surface normal defines a zero-angle condition).

For a source of EM radiation 205 disposed in the peripheral region, a predictable fraction of EM radiation 205 will transit through a number of isolation structures, allowing residual EM radiation 210 to reach active pixels, which can include dark pixels and/or active pixels. In some cases photodiodes can detect residual EM radiation 210, which can increase the dark current signal in a portion of active pixels in a nonuniform way. Such a non-uniform effect can significantly impair the performance of an image sensor by affecting pixels nearer to the EM radiation source differently than pixels farther from the EM radiation source. As dark current is used to correct image data, nonuniformities in dark current over active pixel region 110 can significantly impair image quality.

Even were isolation structures to be disposed between dark pixels and/or active pixels and the EM radiation source, as described in reference to embodiments of the present disclosure illustrated in FIGS. 1A-1B and FIGS. 3A-3C, residual EM radiation 210 would transmit through the rectangular regular isolation structure (e.g., a lattice of cells formed by isolation structure material), much less a single isolation structure with substantially vertical or narrowly tapered sidewalls. Permitting residual EM radiation 210 to reach active pixels, understandably, impairs sensor accuracy and performance by affecting dark current nonuniformly in an affected region of active pixel, before residual EM radiation 210 is attenuated to a level that induces negligible or no dark current in photodiodes of the affected region.

FIG. 2B is a schematic diagram illustrating an overhead-plan view of a rectangular lattice isolation structure and the interaction of EM radiation 205 with surfaces of the isolation structure. The view illustrated in FIG. 2B represents a view from a surface of a conventional image sensor that is analogous to first surface 103 or second surface 105. As in FIG. 2A, components of a conventional image sensor are omitted to focus description on the interaction of EM radiation 205 with the isolation structure. As such, overlying layers, underlying layers, and interstitial materials and structures are omitted from the schematic diagram of FIG. 2B, but it is understood to describe isolation structures formed in a semiconductor substrate by CMOS-compatible fabrication processes, such as patterned etch and deposition of fill materials, as described in more detail in reference to FIG. 1B.

As in FIG. 2A, the EM radiation source generates EM radiation 205 that is transported through the semiconductor substrate toward the isolation structure. As an illustrative example, the EM radiation source is shown as an isotropic heat source (e.g., a point source) generating EM radiation 205 (e.g., where the EM radiation source is a heat source, as in the case where EM radiation source is a power circuit or other electronic component that emits infrared photons). In this case, EM radiation 205 can be transported through the substrate in a linear direction toward the isolation structure and can interact with the isolation structure in accordance with physical principles of optics, such as partial refraction and partial reflection in a manner dependent at least in part on the index of refraction of the substrate, the index of refraction of the isolation structure, and the angle of incidence of the EM radiation 205.

As illustrated, EM radiation incident on a surface of the isolation structure that is aligned orthogonal to the EM radiation source will approach the surface at a low angle of incidence (where 90 degrees corresponds to the surface and zero degrees corresponds to the surface normal). In such a condition, a proportion of transmitted light will be significant and can exceed a proportion of reflected light, where the index of refraction of the material of the isolation structure is lower than the index of refraction of the material of the semiconductor substrate. Further, EM radiation 205 that interacts with lateral surfaces of the isolation structure will exhibit a low angle of incidence, such that reflection becomes favored when the isolation structure has a relatively low index of refraction.

For miniature CMOS image sensors, the characteristic distances between EM radiation source(s) and isolation structures can be on the order of micrometers or even nanometers. As such, formation of hot pixels, characterized by an elevated dark current, or of one or more regions of hot pixels with nonuniform dark current between the region(s) and the remaining active pixels is more likely in the proximity of EM radiation source than distant from the EM radiation source. Understandably, the impact of residual EM radiation 210 reaching active pixels includes impairing the signal-to-noise ratio of the affected pixels, impairing image processing (e.g., dark current correction) by affecting pixel dark current in a nonuniform and unsteady way, owing at least in part to dynamics in heat generation as the image sensor draws greater or lesser power through the EM radiation source.

Figure 3A:
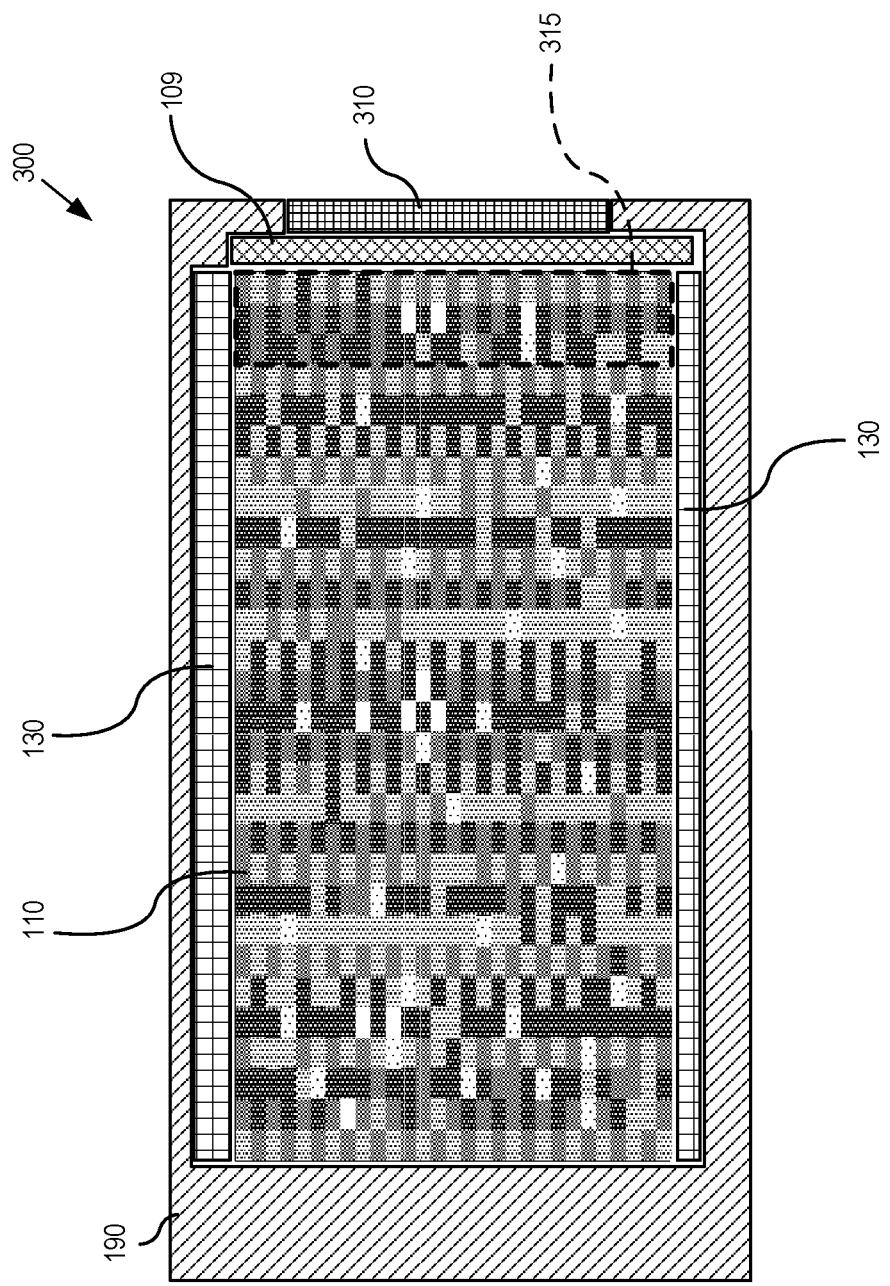
FIG. 3A is a schematic diagram illustrating an example image sensor layout including diagonal deep trench isolation structures configured to improve isolation of active pixels, in accordance with embodiments of the present disclosure.

FIG. 3A is a schematic diagram illustrating an example image sensor 300 layout including diagonal isolation structure 109 configured to improve isolation of active pixels 110, in accordance with embodiments of the present disclosure. Example image sensor 300 includes components described in reference to FIG. 1A. For example, example image sensor 300 includes an ASIC 190, which can be configured to be disposed in peripheral region 140 of example image sensor 300 at least partially surrounding active pixel region 110 and dark pixel region 130. In the forthcoming description, pixels of active pixel region 110 are referred to as active pixels 110 and pixels of dark pixel region 130 are referred to as dark pixels 130.

As described in more detail in reference to FIG. 1A, example image sensor 300 can include a power circuit 310 that includes one or more EM radiation sources 195, including but not limited to sources of infrared radiation or other radiation that can induce an elevated dark current in active pixels 110. Disposed between active pixels 110 and power circuit 310, one or more diagonal isolation structures 109 can be configured to reduce the flux of residual EM radiation 210 (in reference to FIGS. 2A-2B) that reaches a proximal region 315 of active pixels 110 relative to the conventional image sensor described in reference to FIGS. 2A-2B.

In an illustrative example, EM radiation source(s) 195 can include a resistive element that exhibits ohmic heating, a voltage conversion element of power circuit 310 configured to step up a voltage from a supply voltage (e.g., from a battery) to an input voltage for ASIC 190, or other electronic components that generate heat as part of operation. Being thermally coupled with active pixels 110 via substrate 101, generated heat can be transported to proximal region 315 of active pixels by various physical mechanisms including but not limited to conduction, radiation, etc. In some embodiments, power circuit can generate EM radiation 205 that includes energetic photons in the visible spectrum, although transmission of visible photons through substrate 101 is likely to be limited.

In so doing, power circuit 310 can emit EM radiation 205 in an isotropic distribution or in an anisotropic distribution. For example, a resistive element of power circuit 310 can behave as an isotropic point source of thermal radiation. In this way, diagonal isolation structure(s) 109 nearer to localized EM radiation sources 195 can receive a higher incident flux of EM radiation 205. As such, while diagonal isolation structure(s) 109 are shown extending vertically to be at least coextensive with power circuit 310, at least some portion of diagonal isolation structure(s) 109 can be omitted and the area of the substrate can be rededicated to other purposes (e.g., ASIC 190, power circuit 310, other CMOS components such as vias, etc.) where source(s) of EM radiation 195 can be identified during design of power circuit 310 (e.g., by operational simulation) and the radiation transmission patterns pre-determined.

With such information, diagonal isolation structure(s) 109 can be disposed discontinuously in one or more regions of example image sensor 300, localized in the proximity of EM radiation source(s) 195, to attenuate the level of residual EM radiation 210 reaching proximal region 315 while also reserving limited substrate area for other uses. It is understood that the specific locations of EM radiation source(s) 195 can depend on the design of power circuit 310 and/or ASIC(s) 190 used. For at least this reason, the precise placement of diagonal isolation structure(s) 109 can be determined as part of overall sensor design, rather than an a priori specification based on the relative location of active pixels 110 and ASIC 190 components of example image sensor 300.

In some embodiments, diagonal isolation structures can include a sloped sidewall to redirect EM radiation 205 away from proximal region 325 in a third dimension, such as out through first side 103 or out through second side 105. For example, where EM radiation 205 includes thermal radiation, diagonal isolation structure 305 can be configured to redirect EM radiation 205 toward a heatsink thermally coupled with power circuit 310 of example image sensor 300 through first side 103 and/or through second side 105.

Figure 3B:
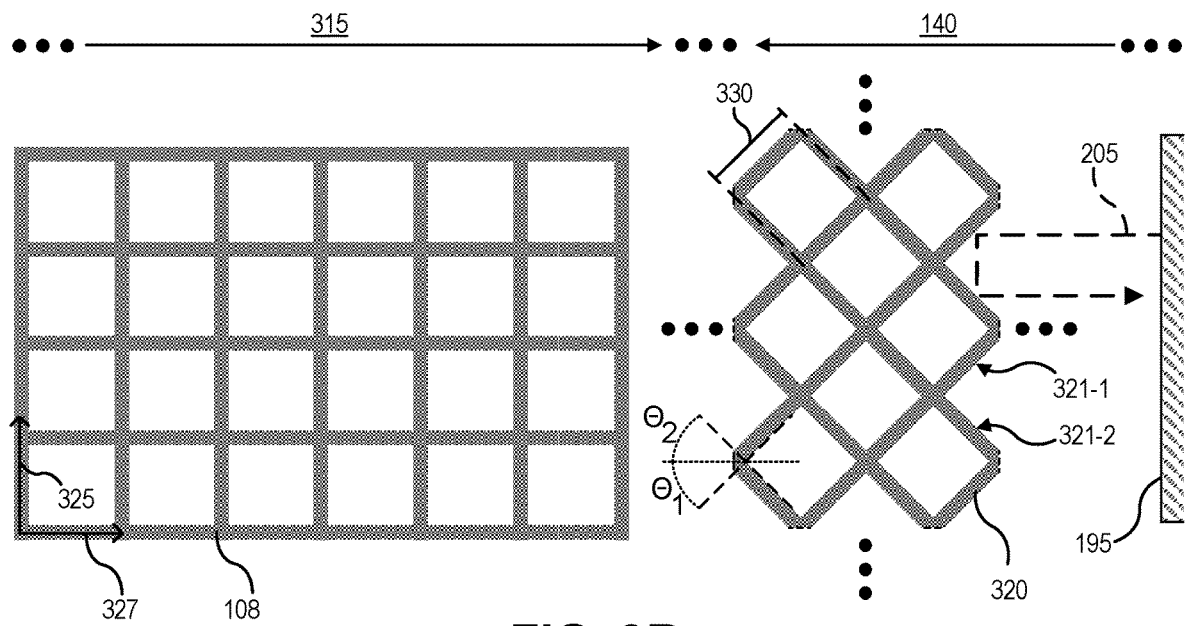
FIG. 3B is a schematic diagram illustrating an example diagonal deep trench isolation structure configured as a lattice structure, in accordance with embodiments of the present disclosure.

FIG. 3B is a schematic diagram illustrating an example diagonal isolation structure 320 configured as a lattice, in accordance with embodiments of the present disclosure. Isolation structure 320 defines a first reflective surface 321-1 oriented on a first bias $\theta_1$ relative to the array of active pixels 110 and a second reflective surface 321-2 oriented on a second bias $\theta_2$ relative to the array of active pixels. In this context, the term "bias" refers to the respective angular orientation of reflective surfaces 321-1 and 321-2 relative to vertical 325 and lateral 327 axes defined by the lattice of isolation structures 108 used to isolate active pixels 110 in active pixel region 110. FIG. 3B illustrates a plan view of diagonal isolation structure 320 that can be formed as described in reference to isolation structures 108 of FIG. 1B. In an illustrative example, a uniform photoresist layer can be patterned with two separate patterns, the first to form isolation structure 108 in active pixel region 110 and the second to form diagonal isolation structure 320 in peripheral region 140. Subsequent removal and deposition operations as described in more detail in reference to FIG. 1B can be implemented concurrently to form both isolation structure 108 and diagonal isolation structure without increasing the number and complexity of fabrication operations.

In some embodiments, first reflective surface 321-1 and second reflective surface 321-2 are biased relative to lateral axis 327 by equal and opposite angles, to form a complementary pair of reflective surfaces configured to redirect EM radiation 205 away from active pixels 110 with paired low-angle reflections. In some embodiments, first bias and second bias can be unequal, as an approach to effect a redirection of incident EM radiation 205 away from active pixels 110 and from power circuit 310.

First bias and/or second bias can be configured such that incident EM radiation 205 that is aligned or approximately aligned with lateral axis 327 interacts with first reflective surface 321-1 and/or second reflective surface 321-2 at an acute angle of incidence rather than a normal angle (e.g., 90 degrees relative to a respective reflective surface 321-1 or 321-2). As described in reference to FIG. 2B, a lower angle of incidence (e.g., closer to a grazing angle or an angle approaching zero degrees relative to a surface) is more likely to reflect incident radiation, where the reflective surface has a relatively lower index of refraction than the medium through which the radiation is traveling. As such, first bias and/or second bias can be configured such that incident EM radiation 205 from EM radiation source(s) 195 near to proximal region 315 is incident at an angle of incidence likely to reflect EM radiation 205. To that end, first bias and/or second bias can be from about 10 degrees to about 90 degrees, from about 15 degrees to about 85 degrees, from about 20 degrees to about 80 degrees, from about 25 degrees to about 75 degrees, from about 30 degrees to about 70 degrees, from about 30 degrees to about 65 degrees, from about 30 degrees to about 60 degrees, from about 35 degrees to about 55 degrees, or from about 40 degrees to about 50 degrees, including fractions and interpolations thereof. For example, first bias and/or second bias can be about 1 degree, about 2 degrees, about 3 degrees, about 4 degrees, about 5 degrees, about 6 degrees, about 7 degrees, about 8 degrees, about 9 degrees, about 10 degrees, about 15 degrees, about 20 degrees, about 25 degrees, about 30 degrees, about 35 degrees, about 40 degrees, about 45 degrees, about 50 degrees, about 55 degrees, about 60 degrees, about 65 degrees, or greater, including fractions and interpolations thereof. First bias and second bias can be equal angles, opposite angles, or different angles. As described in more detail in reference to FIG. 2B, for a bias at an angle approaching orthogonality relative to incident EM radiation 205, reflection will become less favored as opposed to transmission when passing from a higher index of refraction to a lower index of refraction. For that reason, diagonal isolation structure 320 can be configured at a design stage based at least in part on the location and expected direction of EM radiation source(s) 195, such that EM radiation 205 is redirected and/or reflected away from proximal region 315.

In some embodiments, first bias and/or second bias can be determined based at least in part on the critical angle of internal reflection derived from Snell's law. For example, where substrate 101 has a higher index of refraction than diagonal isolation structure(s) 320, a critical angle exists where EM radiation incident at an angle greater than the critical angle will be reflected. In this way, first bias and/or second bias can be about equal to the critical angle for the paired materials or less, which is described by the expression: $\theta_{crit}=\arcsin(n_2/n_1)$ with $n_1$ representing the index of refraction of the higher-index material.

Diagonal isolation structure 320 is illustrated as a repeating lattice of cells defined by a side length 330, of which only a portion is shown. The ellipses " " of FIG. 3B are used to indicate that the lattice can be extended in one or more directions to increase the size of diagonal isolation structure 320 and the number of cells. In some embodiments, lattice 320 can be a regular lattice defining a substantially uniform side length for every reflective surface 321 including reflective surfaces 321-1 and/or 321-2, and thus a size of the cells making up the lattice of cells, that is substantially equal to the size of active pixels 110 defined by isolation structure(s) 108. For example, a fabrication process for diagonal isolation structure 320 can include optical lithographic patterning of a uniform photoresist layer disposed overlying active pixel region 110 and peripheral region 140, where a lattice pattern is transferred onto active pixel region 110 to later define isolation structure(s) 108, after which the substrate is rotated relative to the optical lithography source (e.g., laser) and the same lattice pattern is transferred onto peripheral region 140 to later define diagonal isolation structure(s) 320. While FIG. 3B illustrates diagonal isolation structure(s) 320 as a regular rectangular/square lattice, an irregular lattice can also be provided by spatial variation of side length 330 and/or first bias and/or second bias. Advantageously, introducing spatial variation of lattice geometric parameters can reduce the transmission of EM radiation 205 through vertices or other points in diagonal isolation structure(s) 320, as described in more detail in reference to FIG. 3D.

To that end, side length 330 can approximate the size of an active pixel 110, including but not limited to a length of about 0.1 about 0.2 about 0.3 about 0.4 μm, about 0.5 μm, about 0.6 μm, about 0.7 μm, about 0.8 μm, about 0.9 μm, about 1 μm, about 1.1 μm, about 1.2 μm, about 1.3 μm, about 1.4 μm, about 1.5 μm, about 1.6 μm, about 1.7 μm, about 1.8 μm, about 1.9 μm, about 2.0 μm, about 2.5 μm, about 3.0 μm, about 3.5 μm, about 4.0 μm, about 4.5 μm, about 5.0 μm, about 5.5 μm, about 6.0 μm, about 6.5 μm, about 7.0 μm, about 7.5 μm, about 8.0 μm, about 8.5 μm, about 9.0 μm, about 9.5 μm, about 10.0 μm, about 10.5 μm, about 11.0 μm, about 11.5 μm, about 12.0 μm, about 12.5 μm, about 13.0 μm, about 13.5 μm, about 14.0 μm, about 14.5 μm, about 15.0 μm, or greater, including fractions and interpolations thereof. Side length 330 can be practically limited, however, by space constraints of peripheral region 140 between proximal region 315 and EM radiation source(s) 195. Further, smaller side length 330 corresponds to a denser lattice structure with more repeated instances of first reflective surface 321-1 and second reflective surface 321-2 over a given area. Advantageously, disposing a greater number of reflective surfaces between EM radiation source(s) 195 and proximal region 315 can increase the attenuation of EM radiation 205, reducing the flux of residual EM radiation 210 reaching proximal region 315. Below a lower manufacturability limit of side length 330, however, first reflective surface 321-1 and second reflective surface 321-2 can be indistinct. As such, an effective lower limit on side length can be imposed by process parameters and/or constraints of a semiconductor manufacturing process used to fabricate example image sensor 300.

Figure 3C:
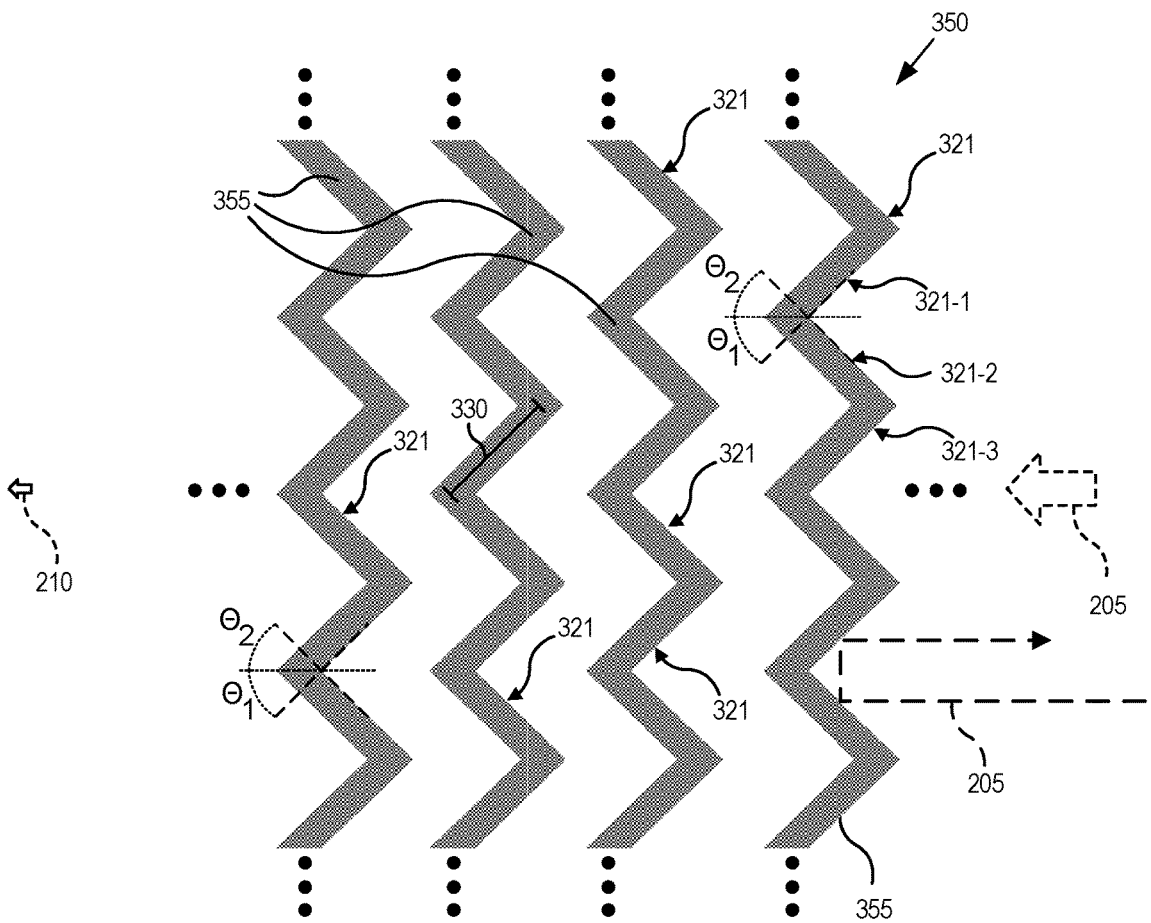
FIG. 3C is a schematic diagram illustrating an example array of diagonal deep trench isolation structures configured to improve isolation of active pixels, in accordance with embodiments of the present disclosure.

FIG. 3C is a schematic diagram illustrating an example array 350 of diagonal isolation structures 355 configured to improve isolation of active pixels 110, in accordance with embodiments of the present disclosure. As described in more detail in reference to FIG. 3B, diagonal isolation structures 355 can be disposed in peripheral region 140 between EM radiation source(s) 195 and proximal region 315, such that EM radiation 205 incident on diagonal isolation structures 355 is attenuated, reducing residual EM radiation 210 up to and including an extent at which the flux of residual EM radiation into proximal region 315 induces negligible or no non-uniform dark current in active pixel region 110. In this context, "negligible" is used to indicate that a non-zero dark current in proximal region 315 that is attributable to residual EM radiation 210 can be tolerated in some instances, for example, by calibration of example image sensor 300, that is unavailable with relatively higher fluxes exhibited with isolation structures described in reference to FIGS. 2A-2B.

As with diagonal isolation structure(s) 320, diagonal isolation structures 355 define first reflective surfaces 321-1 and second reflective surfaces 321-2 according to first bias and second bias, respectively. Similarly, reflective surfaces 321-1 and/or 321-2 can be described by side length 330, as described in more detail in reference to FIG. 3B. In some embodiments, diagonal isolation structures 355 include multiple repeated instances of first reflective surface 321-1 and second reflective surface 321-2 to define a "zig-zag" structure that includes multiple paired reflective surfaces that together act as a contra-directional reflector for incident EM radiation 205. As with diagonal isolation structure(s) 320, the ellipses " . . . " are used to indicate that example array 350 can include more or fewer than four diagonal isolation structures 355, and individual diagonal isolation structures can include more or fewer than four instances of reflective surfaces 321-1 and 321-2. In some embodiments, example array 350 includes one, two, three, four, five, six, seven, eight, nine, ten, or more diagonal isolation structures 355. Understandably, the number of diagonal isolation structures 355 can be constrained by a lower manufacturability limit below which the structures are will not be distinct in a manufactured image sensor, and by an upper limit set by the area available for example array 350.

Advantageously, diagonal isolation structures 355 be formed in substrate 101 without bridging between individual isolation structures 355. As such, incident EM radiation 205 that is partially transmitted into material of diagonal isolation structures 355 can be isolated within diagonal isolation structures 355 (e.g., by internal reflection), without being transported nearer to proximal region 315. Additionally, diagonal isolation structures 355 can be offset relative to each other, as described in more detail in reference to FIG. 3D, as an approach to limiting the transmission of EM radiation 205 through vertices 387 (in reference to FIG. 3D) joining reflective surfaces 321.

Figure 3D:
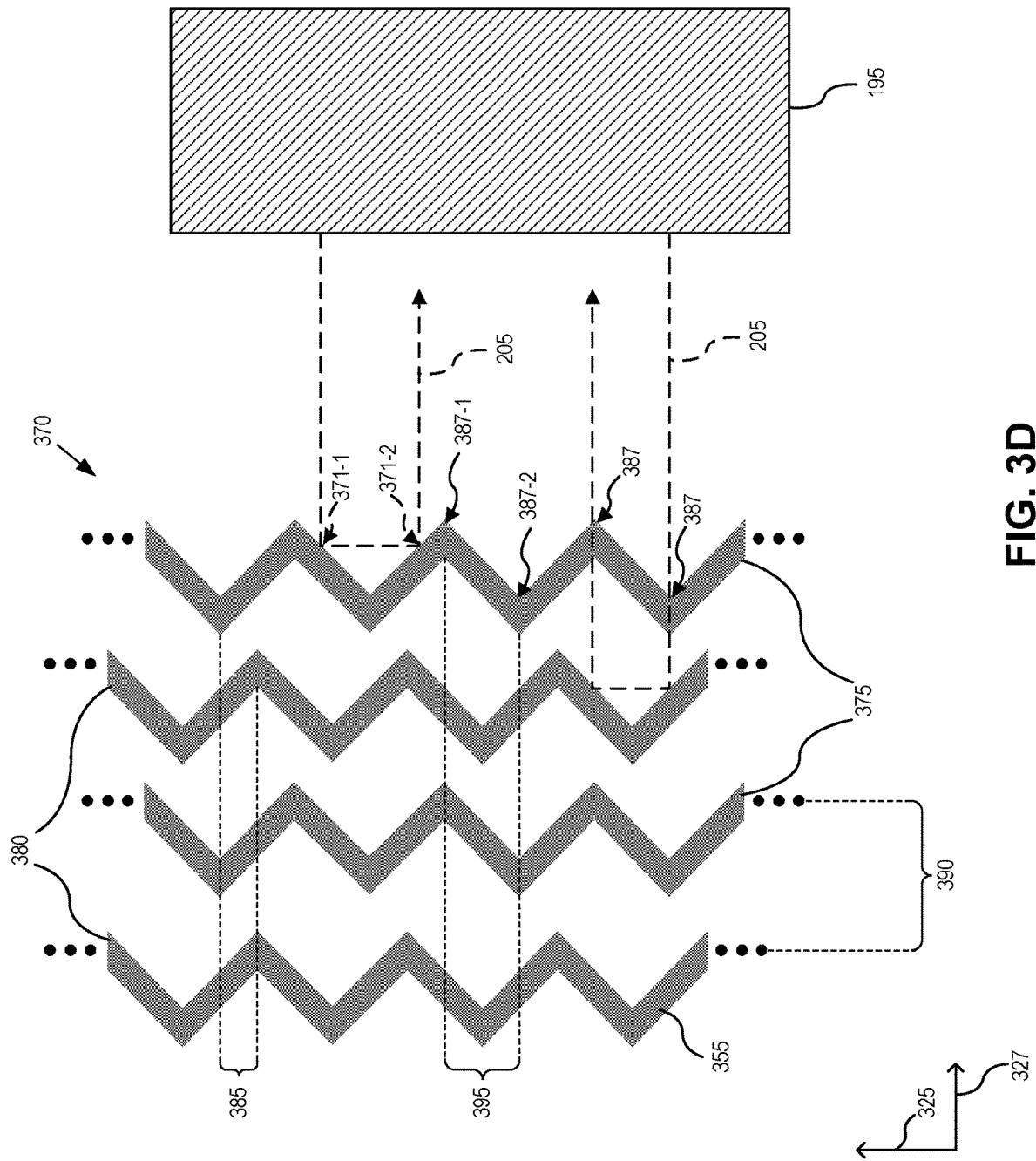
FIG. 3D is a schematic diagram illustrating an example staggered array of diagonal deep trench isolation structures configured to improve isolation of active pixels, in accordance with embodiments of the present disclosure.

FIG. 3D is a schematic diagram illustrating an example staggered array 370 of diagonal isolation structures 355 configured to improve isolation of active pixels, in accordance with embodiments of the present disclosure. Example staggered array 370 is an example of diagonal isolation structure 109 of FIG. 1A and, like example array 350, an example of diagonal isolation structure 305 of FIG. 3A. Staggered array 370 includes a first subset 375 of diagonal isolation structures 355 and a second subset 380 of diagonal isolation structures 355. In example staggered array 370, first subset 375 is offset from second subset 380 along vertical axis 325 by a vertical offset 385 and is offset along lateral axis 327 by a lateral offset 395. In some embodiments, the lateral offset 395 can be comparable to side length 330, for example, being in a range from about 0.1 μm to about 15 μm. For example, lateral offset can be about 0.1 μm, about 0.2 μm, about 0.3 μm, about 0.4 μm, about 0.5 μm, about 0.6 μm, about 0.7 μm, about 0.8 μm, about 0.9 μm, about 1 μm, about 1.1 μm, about 1.2 μm, about 1.3 μm, about 1.4 μm, about 1.5 μm, about 1.6 μm, about 1.7 μm, about 1.8 μm, about 1.9 μm, about 2.0 μm, about 2.5 μm, about 3.0 μm, about 3.5 μm, about 4.0 μm, about 4.5 μm, about 5.0 μm, about 5.5 μm, about 6.0 μm, about 6.5 μm, about 7.0 μm, about 7.5 μm, about 8.0 μm, about 8.5 μm, about 9.0 μm, about 9.5 μm, about 10.0 μm, about 10.5 μm, about 11.0 μm, about 11.5 μm, about 12.0 μm, about 12.5 μm, about 13.0 μm, about 13.5 μm, about 14.0 μm, about 14.5 μm, about 15.0 μm, or greater, including fractions and interpolations thereof. In general, a smaller spacing permits a larger number of diagonal isolation structures 355 to be included in example array 350. The lower limit of the spacing can be based at least in part on maintaining a separation between diagonal isolation structures 355. The upper limit of the spacing can be based at least in part on area constraints in peripheral region 140.

As described in reference to example array 350, example staggered array 370 can include more or fewer than four diagonal isolation structures 355 and can be extended in either vertical direction to include more than four instances of first reflective surface 321-1 and/or 321-2. As with previous example isolation structures described in reference to FIGS. 3B-3C, reflective surfaces 321 defined by diagonal isolation structures 355 can be configured to attenuate EM radiation 205 by pairing a first reflection 371-1 and a second reflection 371-2 by the first reflective surface 321-1 and the second reflective surface 321-2. It is understood that the first reflection 371-1 can occur on the first reflective surface 321-1 or the second reflective surface 321-2, as illustrated by the different ray lines of EM radiation 205.

At junctions between reflective surfaces 321, diagonal isolation structures 355 can define vertices 381, including a first vertex 387-1 and a second vertex 387-2. Using vertices 381 as a reference, vertical offset 385 can be about half of a vertical distance 395 between first vertex 387-1 and second vertex 387-2. Advantageously, configuring staggered array 370 with vertical offset can permit EM radiation 205 incident on a vertex 387 of a diagonal isolation structure 355 of first subset 375, where EM radiation 205 is more lightly to be transmitted than EM radiation 205 incident on reflective surfaces 321, to be reflected by a diagonal isolation structure 355 of the second subset 380. Where vertical offset 385 is about half of vertical distance 395, paired reflections 371 will redirect EM radiation through a neighboring vertex 387.

In some embodiments, vertical offset 385 can be greater than or less than vertical distance 395. Advantageously, such a configuration can serve to retain EM radiation in substrate 101 between diagonal isolation structures 355, to be removed through first surface 103 and/or second surface 105, rather than being redirected in to source of EM radiation 195.

It is appreciated that the various process steps involved in the preparation of diagonal isolation structure 109 (e.g., diagonal isolation structure 305 as illustrated in FIGS. 3A-3D) can be implemented using existing CMOS manufacturing techniques such as, but not limited to photolithograph, metal deposition (e.g., atomic layer deposition, physical vapor deposition, thermal evaporation, magnetron sputtering, or the like, etching techniques (e.g., dry etching techniques such as plasma etching, wet etching techniques such as chemical etching, or the like), and planarization techniques (e.g., chemical-mechanical polishing). It is understood that CMOS manufacturing systems typically reproduce a pattern within a process tolerance that permits some level of deviation from an exact design. Edge placement error (EPE) is an example figure of merit used to describe the precision and accuracy of a CMOS process, where an EPE value below an allowable tolerance can include deviations that are tolerated.

In some cases, tolerance(s) can be based at least in part on the functionality of the resulting structure(s). For example, for diagonal isolation structure(s) 320 and/or 355 an attenuation of residual EM radiation 210 below a tolerable level (e.g., by an undetectable or effectively undetectable dark signal from proximal region 315) can serve as a criterion for determining a manufacturing precision tolerance. In this way, the term "substantially" as in the context of "substantially aligned," "substantially parallel," "substantially orthogonal," or the like, can be interpreted to indicate a structure that exhibits the stated property within manufacturing tolerances. Similarly, terms including but not limited to "approximately" that are used to describe a minor or tolerable deviation from the stated condition or property can be understood to apply to structures that are manufactured according to a design that includes the stated condition or property, where the manufacturing process can introduce the tolerable deviation.

Figure 4:
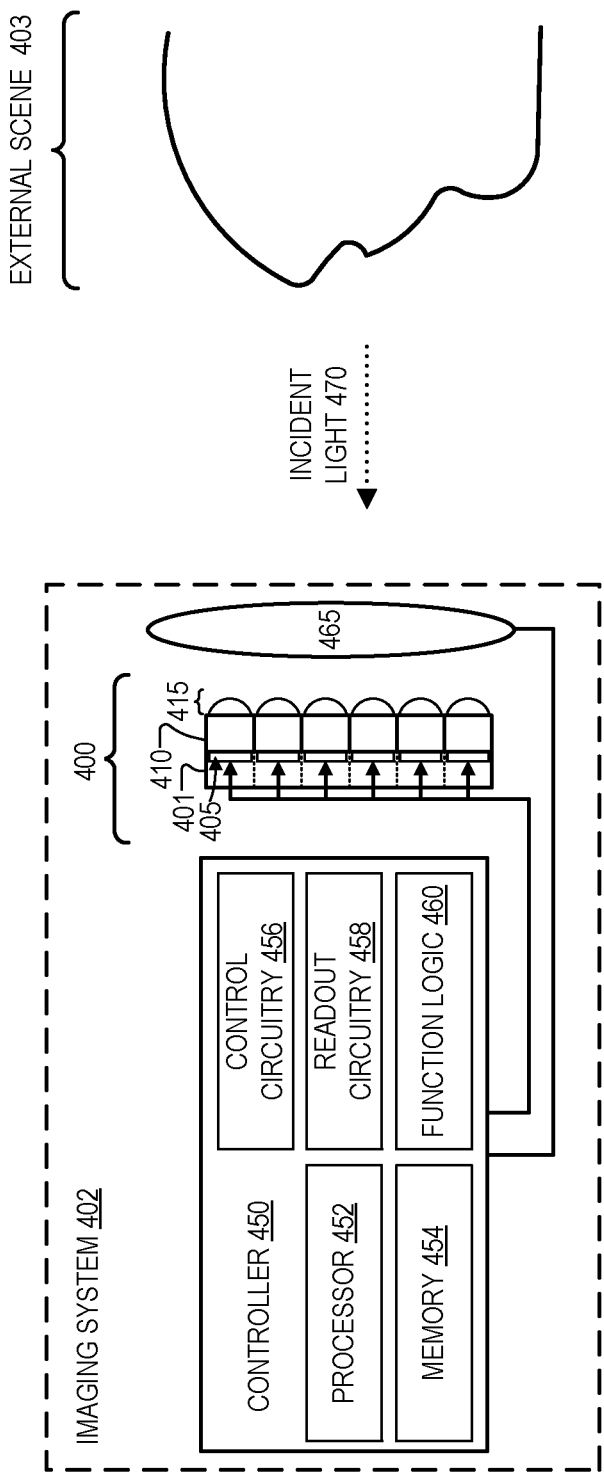
FIG. 4 is a functional block diagram of an imaging system including an image sensor with multi-layer metal stacks, in accordance with the teachings of the present disclosure.

FIG. 4 is a functional block diagram of an imaging system 402 including an image sensor 400 with diagonal isolation structures, in accordance with the teachings of the present disclosure. The image sensor 400 can have a structure corresponding to image sensor 100 illustrated in FIGS. 1A-1B and/or example image sensor 300 illustrated in FIG. 3A. The imaging system 402 includes image sensor 400 to generate electrical or image signals in response to incident light 470, objective lens(es) 465 with adjustable optical power to focus on one or more points of interest within the external scene 403, and controller 450 to control, inter alia, operation of image sensor 400 and objective lens(es) 465. Image sensor 400 is one possible implementation of image sensor 100 illustrated in FIGS. 1A-1B and/or example image sensor 300 illustrated in FIG. 3A. Image sensor 400 is a simplified schematic showing a semiconductor material 401 with a plurality of photodiodes 405 disposed within respective portions of the semiconductor material 401, a plurality of color filters 410, and a plurality of microlenses 415. The controller 450 includes one or more processors 452, memory 454, control circuitry 456, readout circuitry 458, and function logic 460.

The controller 450 includes logic and/or circuitry to control the operation (e.g., during pre-, post-, and in situ phases of image and/or video acquisition) of the various components of imaging system 402. The controller 450 can be implemented as hardware logic (e.g., application specific integrated circuits, field programmable gate arrays, system-on-chip, etc.), software/firmware logic executed on a general purpose microcontroller or microprocessor, or a combination of both hardware and software/firmware logic. In one embodiment, the controller 450 includes the processor 452 coupled to memory 454 that stores instructions for execution by the controller 450 and/or one or more other components of the imaging system 402. The instructions, when executed, can cause the imaging system 402 to perform operations associated with the various functional modules, logic blocks, or circuitry of the imaging system 402 including one of, or a combination of, the control circuitry 456, the readout circuitry 458, the function logic 460, image sensor 400, objective lens 465, and another element of imaging system 402 (illustrated or otherwise). The memory is a non-transitory computer-readable medium that can include, without limitation, a volatile (e.g., RAM) or non-volatile (e.g., ROM) storage system readable by controller 450. It is further appreciated that the controller 450 can be a monolithic integrated circuit, one or more discrete interconnected electrical components, or a combination thereof. Additionally, in some embodiments one or more electrical components can be coupled together to collectively function as controller 450 for orchestrating operation of the imaging system 502.

Control circuitry 456 can control operational characteristics of the photodiode array 405 (e.g., exposure duration, when to capture digital images or videos, and the like). Readout circuitry 458 reads or otherwise samples the analog signal from the individual photodiodes (e.g., read out electrical signals generated by each of the plurality of photodiodes 405 in response to incident light to generate image signals for capturing an image frame, and the like) and can include amplification circuitry, analog-to-digital (ADC) circuitry, image buffers, or otherwise. In the illustrated embodiment, readout circuitry 458 is included in controller 450, but in other embodiments readout circuitry 458 can be separate from the controller 450. Function logic 460 is coupled to the readout circuitry 458 to receive image data to demosaic the image data and generate one or more image frames. In some embodiments, the electrical signals and/or image data can be manipulated or otherwise processed by the function logic 460 (e.g., apply post image effects such as crop, rotate, remove red eye, adjust brightness, adjust contrast, or otherwise).

The processes explained above can be implemented using software and/or hardware. The techniques described can constitute machine-executable instructions embodied within a tangible or non-transitory machine (e.g., computer) readable storage medium, that when executed by a machine (e.g., controller 450 of FIG. 4) will cause the machine to perform the operations described. Additionally, the processes can be embodied within hardware, such as an application specific integrated circuit ("ASIC"), field programmable gate array (FPGA), or otherwise.

A tangible machine-readable storage medium includes a mechanism that provides (i.e., stores) information in a non-transitory form accessible by a machine (e.g., a computer, network device, personal digital assistant, manufacturing tool, a device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:
1. An image sensor, comprising:
 a source of electromagnetic radiation disposed in a peripheral region on a substrate;
 a pixel array disposed in an active pixel region on the substrate and thermally coupled with the source of electromagnetic radiation; and
 an isolation structure disposed in the peripheral region on the substrate between the source of electromagnetic radiation and the pixel array, the isolation structure defining a first reflective surface oriented on a first bias relative to a lateral axis of the pixel array and a second reflective surface oriented on a second bias relative to the lateral axis,
 wherein the isolation structure is configured to attenuate residual electromagnetic radiation reaching a proximal region of the pixel array by pairing a first reflection and a second reflection of the electromagnetic radiation by the first reflective surface and the second reflective surface, and wherein the isolation structure comprises an array of diagonal isolation structures comprising a first subset of diagonal isolation structures and a second subset of diagonal isolation structures.

2. The image sensor of claim 1, wherein the first reflective surface and the second reflective surface are reflective to electromagnetic radiation in an infrared energy range.

3. The image sensor of claim 1, wherein the first bias describes a first angle relative to the lateral axis less than 90 degrees.

4. The image sensor of claim 3, wherein the first angle relative to the lateral axis is from 30 degrees to 60 degrees.

5. The image sensor of claim 4, wherein first angle relative to the lateral axis is 45 degrees.

6. The image sensor of claim 4, wherein the first angle relative to the lateral axis is less than or equal to a critical angle for internal reflection for the substrate and the isolation structure.

7. The image sensor of claim 6, wherein the second bias describes a second angle relative to the lateral axis from 30 degrees to 60 degrees.

8. The image sensor of claim 6, wherein the second angle relative to the lateral axis is symmetrical to the first angle relative to the lateral axis.

9. The image sensor of claim 1, wherein the first reflective surface or the second reflective surface has a side length from 0.1 μm to 20 μm.

10. The image sensor of claim 9, wherein a diagonal isolation structure of the array of diagonal isolation structures defines a third reflective surface oriented on the first bias, and wherein the second reflective surface is adjacent to the first reflective surface and the third reflective surface.

11. The image sensor of claim 9, wherein the isolation structure comprises silicon oxide.

12. The image sensor of claim 9, wherein the substrate defines a lateral axis and a vertical axis normal to the lateral axis, wherein the first subset of diagonal isolation structures is offset from the second subset of diagonal isolation structures along the lateral axis by a lateral offset, and wherein the first subset of diagonal isolation structures is offset from the second subset of diagonal isolation structures along the vertical axis by a vertical offset.

13. The image sensor of claim 12, wherein a diagonal isolation structure of the first subset of diagonal isolation structures comprises a first vertex and a second vertex, and wherein the vertical offset is about half of a vertical distance between the first vertex and the second vertex.

14. An isolation structure, comprising:
a substrate comprising active pixel regions and peripheral regions including a plurality of diagonal isolation structures in the peripheral regions, the substrate defining a lateral axis and a vertical axis normal to the lateral axis,
wherein a diagonal isolation structure of the plurality of diagonal isolation structures defines a first reflective surface oriented on a first bias relative to the lateral axis and a second reflective surface oriented on a second bias relative to the lateral axis,
and wherein the diagonal isolation structure is configured to attenuate electromagnetic radiation by pairing a first reflection and a second reflection of the electromagnetic radiation by the first reflective surface and the second reflective surface.

15. The isolation structure of claim 14, wherein the first bias describes a first angle relative to the lateral axis from 30 degrees to 60 degrees.

16. The isolation structure of claim 15, wherein the second bias describes a second angle relative to the lateral symmetrical to the first angle relative to the lateral axis.

17. The isolation structure of claim 14, wherein the first reflective surface or the second reflective surface has a side length from 0.1 μm to 20 μm.

18. The isolation structure of claim 14, wherein a first subset of diagonal isolation structures of the plurality of diagonal isolation structures is offset from a second subset of diagonal isolation structures of the plurality of diagonal isolation structures along the vertical axis by a vertical offset.

19. The isolation structure of claim 18, wherein a diagonal isolation structure of the first subset of diagonal isolation structures comprises a first vertex and a second vertex, and wherein the vertical offset is half of a length between the first and second vertex of a projection of a trench onto the vertical axis.

* * * * *